United States Patent
Lin (10) Patent No.: US 6,967,603 B1
(45) Date of Patent: Nov. 22, 2005

(54) ADC BACKGROUND CALIBRATION TIMING

(75) Inventor: Chia-Liang Lin, Union City, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 10/894,927

(22) Filed: Jul. 19, 2004

(51) Int. Cl.$^7$ ............................................. H03M 1/10

(52) U.S. Cl. ...................................... 341/120; 341/118

(58) Field of Search .................. 341/120, 118, 131, 341/157, 155

(56) References Cited

U.S. PATENT DOCUMENTS

| | | | |
|---|---|---|---|
| 5,499,027 | A | 3/1996 | Karanicolas et al. |
| 6,184,809 | B1 * | 2/2001 | Yu ............................. 341/120 |
| 6,473,012 | B2 | 10/2002 | Hellberg et al. |
| 6,606,042 | B2 * | 8/2003 | Sonkusale et al. .......... 341/120 |
| 6,717,536 | B2 * | 4/2004 | Jonsson ...................... 341/120 |
| 6,784,815 | B2 * | 8/2004 | Jonsson ...................... 341/120 |
| 6,822,601 | B1 * | 11/2004 | Liu et al. .................... 341/161 |

OTHER PUBLICATIONS

Galton, I, "Digital Cancellation of D/A Converter Noise in Pipelined A/D Converters," IEEE Transactions on Circuits and Systems II: Analog and Digital Signal Processing, vol. 47, No. 3, pp 185-196, Mar. 2000.

* cited by examiner

Primary Examiner—Peguy JeanPierre
Assistant Examiner—Joseph Lauture
(74) Attorney, Agent, or Firm—Daniel J. Bedell; Smith-Hill and Bedell (57) ABSTRACT

A background calibrating, skip and fill, analog/digital converter (ADC) generates an output data sequence having successive data elements representing magnitudes of successive samples of an analog input signal (X) acquired during successive cycles of a clock signal. The ADC normally samples the analog input signal during most clock cycles, but occasionally executes a calibration cycle in which it samples a reference signal of known magnitude, determines the error in its output data, and calibrates itself to eliminate the error. The ADC calculates a magnitude of data elements of the output sequence corresponding to samples of the input signal that were skipped during a calibration cycle by interpolating preceding and succeeding sample values. The ADC initiates a calibration cycle when a variation in magnitudes of at least two most recent samples of the input signal has remained within a first predetermined limit, provided that a predetermined minimum number of clock signal cycles have occurred since the calibration timing circuit last initiated a calibration cycle. The ADC may also refrain from initiating a calibration cycle unless a magnitude of a most recent sample of input signal is within a second predetermined limit.

18 Claims, 4 Drawing Sheets

ADC BACKGROUND CALIBRATION TIMING

BACKGROUND OF THE INVENTION

1. Field of the Invention

The invention relates in general to analog/digital converters (ADCs) and in particular to a method and apparatus for timing background calibration in an ADC.

2. Description of Related Art

Figure 1:
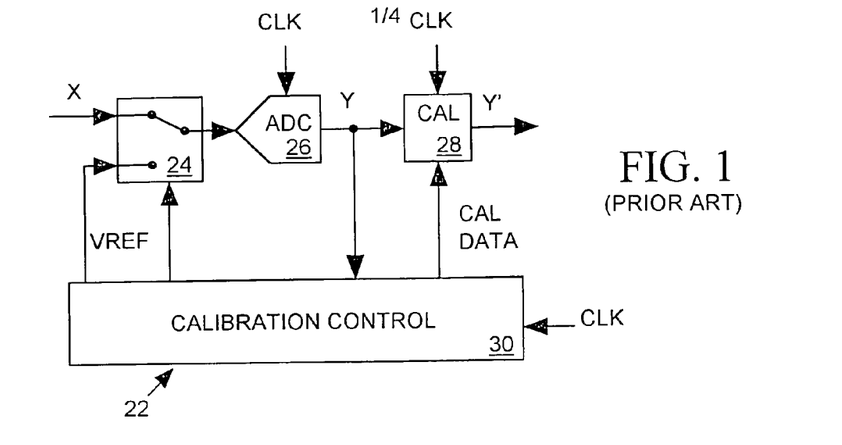
FIG. 1 depicts a prior art foreground calibrating analog/digital converter (ADC) in block diagram form.

FIG. 1 depicts a typical prior art, self-calibrating, analog-digital converter (ADC) 22 for digitizing an analog input signal X to produce a digital data sequence Y' representing the voltage of signal X at successive edges of a clock signal CLK. Input signal X passes through a switch 24 to the input of an ADC 26. In response to each edge of clock signal CLK, ADC 26 samples signal X and produces a "raw", uncalibrated, digital output sequence Y supplied as input to a calibration circuit 28. For example, calibration circuit 28 may act as a lookup table, altering the value of each element of sequence Y' as necessary to compensate for errors in the output sequence Y of ADC 26, thereby to produce a corresponding element of output sequence Y'. During a calibration process, a calibration control circuit 30 supplies a reference signal VREF of various known voltages as input to ADC 26 via switch 24, monitors ADC output Y to determine its error, and supplies programming data to calibration circuit 28 configuring it to appropriately compensate for detected errors in Y. While FIG. 1 depicts an ADC 22 including a calibration circuit 28 for altering the output of ADC 26, other self-calibrating ADCs use other approaches to calibration. For example, calibration control circuit 30 could calibrate ADC 26 by adjusting the gain and offset of an input amplifier within ADC 26, thereby eliminating the need for calibration circuit 28.

The errors in the output of ADC 26 arise due to various "non-ideal" effects associated with its internal components, including the settling time of its internal sample and hold amplifier, the finite gain and offset of its internal amplifier(s), and reflections and other effects due to component mismatches. These sources of error typically limit the speed and accuracy of ADC 26 and impose stringent requirements on its component design that can prolong design time and increase hardware cost. By compensating for errors in the output of ADC 26, calibration circuit 28 can reduce the severity of the ADC's component design requirements, thereby reducing design time and hardware cost.

ADC calibration techniques fall into two categories: foreground calibration and background calibration. ADC 22 of FIG. 1 employs foreground calibration wherein calibration control circuit 30 calibrates ADC 22 only once, during a start-up period following power-on when ADC 22 is not actively digitizing input signal X to produce output sequence Y'. After programming calibration circuit 28, calibration control circuit 30 signals switch 24 to supply input signal X to ADC 26 so that ADC 22 enters its normal mode of operation, continuously digitizing input signal X to produce output sequence Y'. The main drawback to foreground calibration is that since the ADC is calibrated only once at startup, the ADC can drift out of calibration over time. Operating characteristics of components of ADC 26 can change over time, for example due to temperature changes and circuit aging, and such changes can cause the error in output data sequence Y to drift. ADCs employing background calibration repeatedly carry out the calibration process "in the background" while the ADC is digitizing an analog input signal to update ADC calibration from time-to-time to compensate for drift in ADC error.

Figure 2:
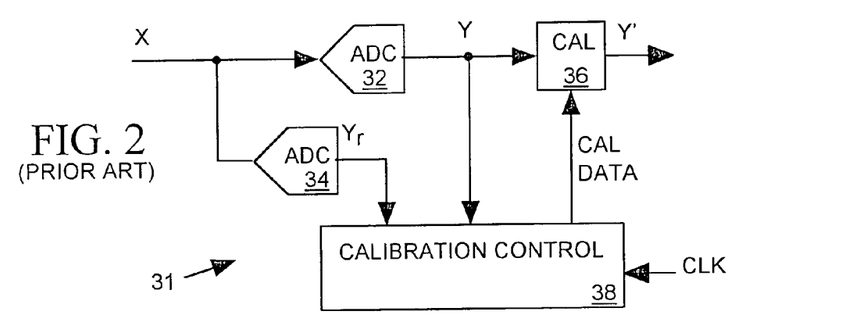
FIGS. 2 and 3 depict prior art background calibrating ADCs in block diagram form.

FIG. 2 illustrates a prior art self-calibrating ADC 31 employing a form of background calibration. Here the analog signal X being digitized provides an input to a high-speed, but inaccurate, ADC 32 as well as to a lower speed, but highly accurate, ADC 34. A calibration circuit 36 modifies the output sequence Y of ADC 32 to compensate for errors, thereby to produce the digitizer output sequence Y'. A calibration control circuit 38 compares each element of the output sequence $Y_r$ of ADC 34 to an element of output sequence Y of ADC 32 representing a concurrently acquired sample of input signal X to determine the error in sequence Y and then appropriately adjusts the programming of calibration circuit 36. This approach has the disadvantage of requiring a highly accurate ADC 34 not subject to errors that drift over time, and such an ADC can be difficult and expensive to design and implement. U.S. Pat. No. 6,606,042 issued Aug. 12, 2003 to Sonkusale et al teaches this type of background calibration method in the context of a pipelined ADC.

The article by I. Galton, "Digital Cancellation of D/A Converter Noise in Pipelined A/D converters," *IEEE Transactions on Circuits and Systems II: Analog and Digital Signal Processing*, vol. 47 no. 3, pp. 185–196, March 2000, discusses another approach to background calibration wherein a known pseudo-random reference signal is added to the normal analog input to produce a modified input to the ADC. The value of the reference signal is then subtracted from the raw ADC output data to produce the digital data representing the analog input signal. A calibration control circuit uses statistical analysis techniques to extract the ADC error from the raw ADC output data so that it can determine how to appropriately adjust the raw data to compensate for the ADC error. One disadvantage to this approach is that adding the reference signal to the input signal reduces the usable dynamic range of the normal input.

According to sampling theory, the information carried by an analog signal can be fully preserved by discrete-time samples when an ADC's sampling rate is higher than twice the highest frequency components of the signal. For a "Nyquist rate" ADC, the sampling rate just meets that criterion. When an ADC uses a sampling rate higher than needed, it has extra resources available to do the calibration in the background. Once in a while it can replace the normal analog input signal with a reference signal of known magnitude to check the ADC's error. The ADC later fills in the output data sequence with output data representing the sample of the normal analog input signal that was "skipped" during the calibration cycle by interpolating preceding and subsequent sample values. This "skip and fill" type of background calibration works well but adds overhead by requiring a higher than normal sampling speed.

Figure 3:
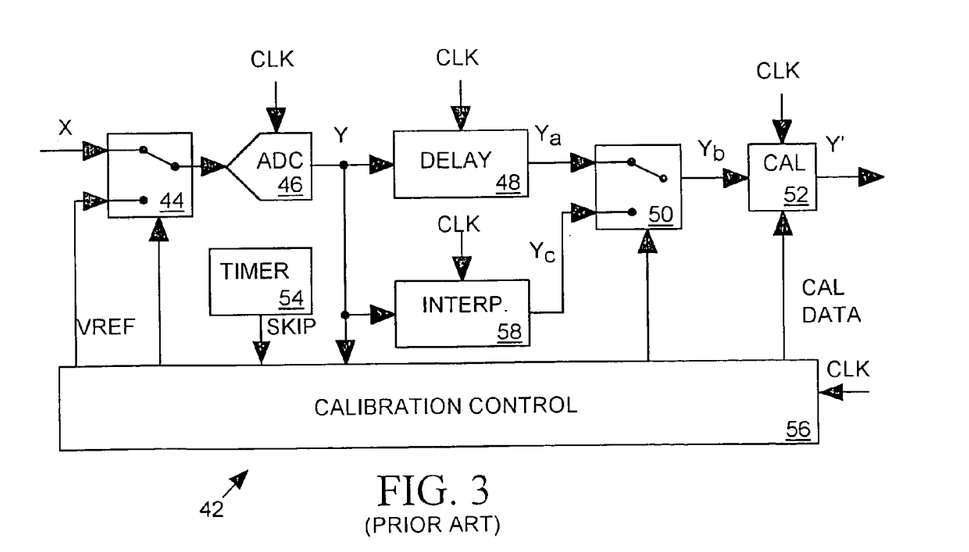
Figure 4:
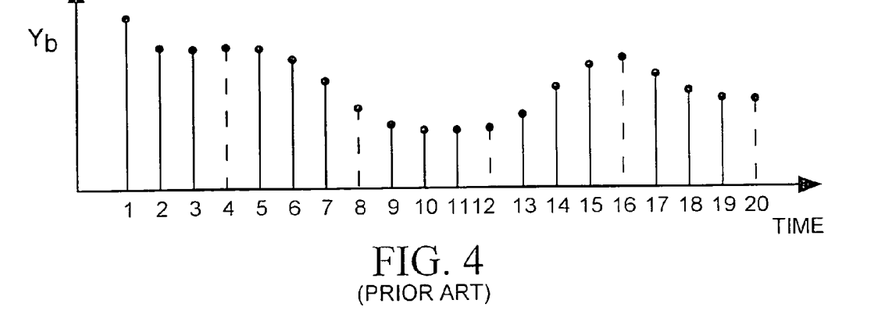
FIGS. 4 and 5 are graphs plotting the value of the output data of the ADC of FIG. 2 as functions of time.

FIG. 3 depicts a self-calibrating ADC 42 employing skip and fill background calibration. A switch 44 normally passes analog input signal X to an ADC 46 producing output sequence Y. A delay circuit 48 delays Y by a number of clock cycles to produce an output sequence $Y_a$. A switch 50 normally supplies sequence $Y_a$ as an input sequence $Y_b$ to a calibration circuit 52 programmed to adjust values of elements of sequence $Y_b$ to compensate for errors in sequence Y caused by ADC 46. A timer circuit 54 periodically sends a SKIP signal to a calibration control circuit 56 telling it to carry out a calibration procedure wherein it supplies a known reference voltage as input to ADC 46 via switch 44 in place of input signal X for one cycle of clock signal CLK so that calibration control circuit 56 can monitor Y and adjust the programming of calibration circuit 52 as necessary. During each clock cycle in which ADC 46 receives reference signal VREF, rather than input signal X, ADC output signal Y will reflect the magnitude of VREF rather than the magnitude of input signal X. Delay circuit 48 delays Y for K cycles of clock signal CLK, so during the $K^{th}$ clock cycle following a cycle in which ADC 46 digitizes VREF, the value of the current element of sequence $Y_a$ will reflect the magnitude of reference signal VREF rather than input signal X. Calibration control circuit 56 therefore signals switch 50 to pass the output $Y_c$ of an interpolation filter 58, rather than $Y_a$ as input $Y_b$ to calibration circuit 52. Interpolation filter 58 uses interpolation to estimate an appropriate value of the current element of $Y_c$ as a function of values of proceeding and succeeding elements of the Y sequence. The K cycle delay of the delay circuit 48 matches the processing latency of the interpolation filter 58. For example, FIG. 4 shows the value of $Y_b$ as a function of time in a case where calibration control circuit 56 performs a calibration operation on every fourth cycle of the CLK signal. Thus, interpolation filter 58 provides the value of $Y_c$ on clock cycles 4, 8, 12, 16, and 20 although in practice, the calibration process is carried out much less frequently. Since changes in error of ADC 46 normally occur relatively slowly, the average time between calibration cycles can usually be made quite long without significantly affecting the ability of the calibration process to compensate for changes in ADC 46.

Figure 5:
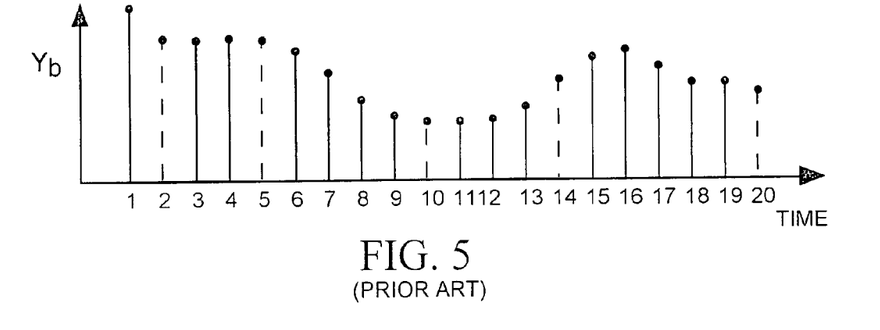

U.S. Pat. No. 6,473,012 discloses a "randomized timing" type of skip and fill background calibration. To implement that kind of skip and fill background calibration, timer 54 could be a random or pseudo-random time interval generator that asserts the SKIP signal with randomly or pseudo-randomly varying time intervals. Thus, as illustrated in FIG. 5, calibration cycles might occur, for example, at 2, 5, 10, 14, and 20. Randomized timing skip and fill background calibration avoids overlooking any periodic error pattern in Y that could be missed using a fixed timing skip and fill background calibration technique.

In either type of skip and fill background calibration, interpolation filter 58 estimates the values of skipped samples of input signal X based on values interpolated from neighboring samples. The interpolated values will have some error, but if a highly accurate, finite impulse response (FIR) filter with many taps implements interpolation filter 58, the interpolation errors can be very small. However, a high performance interpolation filter 58 not only requires substantial hardware but also introduces long latency because it has to buffer sample data over a long period before and after a skipped sample to accurately interpolate the skipped value.

What is needed is an ADC using skip and fill background calibration that can achieve relatively high interpolation accuracy using an interpolation filter having a relatively small number of taps and having a relatively short latency.

SUMMARY OF THE INVENTION

A background calibrating, skip and fill, analog/digital converter (ADC) generates an output data sequence having successive data elements representing magnitudes of successive samples of an analog input signal (X) acquired during successive cycles of a clock signal. The ADC normally samples the analog input signal during most clock cycles, but occasionally executes a calibration cycle in which it samples a reference signal of known magnitude, determines the error in its output data, and calibrates itself to eliminate the error. An interpolation filter within the ADC calculates a magnitude of data elements of the output sequence corresponding to samples of the input signal that were skipped during a calibration cycle by interpolating preceding and succeeding sample values.

In accordance with one aspect of the invention, the ADC initiates a calibration cycle when a variation in magnitudes of at least two most recent samples of the input signal has remained within a first predetermined limit. This improves the accuracy of the interpolation filter because the interpolation need only interpolate between data elements that are relatively similar in magnitude.

In accordance with another aspect of the invention, the ADC refrains from initiating a calibration cycle until a predetermined minimum number of clock signal cycles have occurred since the calibration timing circuit last initiated a calibration cycle.

In accordance with a further aspect of the invention, the ADC may also refrain from initiating a calibration cycle unless a magnitude of a most recent sample of the input signal is within a second predetermined limit.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a self-calibrating analog/digital converter (ADC) employing an improved "skip and fill" background calibration. While the specification below describes example implementations of the invention believed to be the best modes of practicing the invention, other implementations of the invention are possible. Thus, the claims appended to the specification, rather than the descriptions of the example implementations of the invention described below, are intended to define the true scope of the invention.

Figure 6:
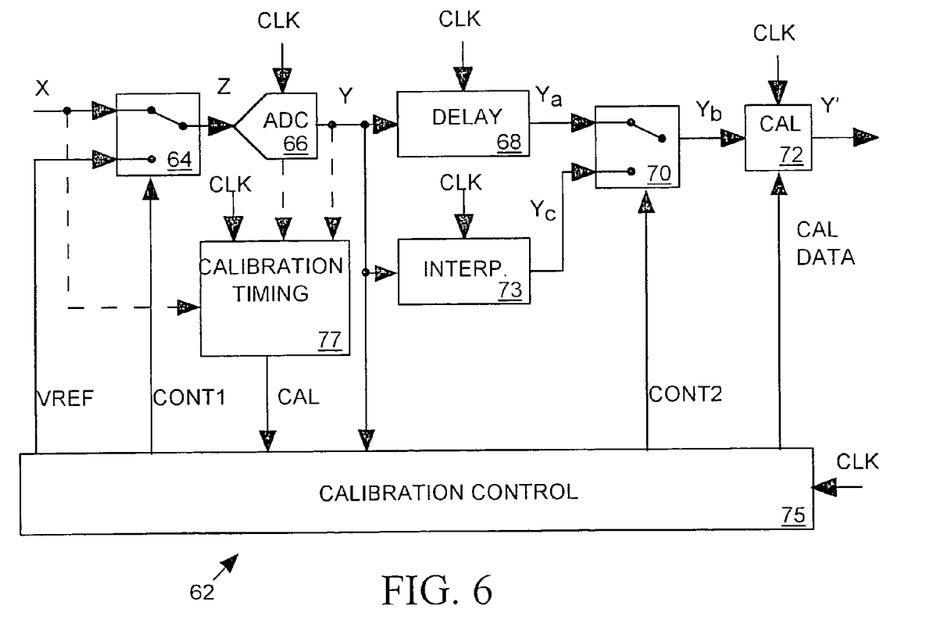
FIG. 6 depicts an example background calibrating ADC in accordance with the invention in block diagram form.

FIG. 6 depicts a self-calibrating ADC 62 in accordance with the invention for generating an output data sequence Y' representing magnitudes of successive samples of an analog input signal X acquired on successive edges of a clock signal CLK. A switch 64, controlled by a control signal CONT1, normally passes analog input signal X as an input signal Z to an ADC 66 producing a digital data sequence Y representing magnitudes of successive samples of analog signal X. A delay circuit 68 delays Y by a number of clock cycles to produce an output sequence $Y_a$. A switch 70 controlled by a control signal CONT2, normally supplies sequence $Y_a$ as an input sequence $Y_b$ to a calibration circuit 72 programmed to adjust values of elements of sequence $Y_b$ to compensate for errors in sequence Y caused by ADC 66.

ADC 62 employs a "skip and fill" type of background calibration wherein a calibration control circuit 75, supplying control signals CONT1 and CONT2, occasionally signals switch 64 to pass a reference signal VREF of known magnitude as the input signal Z to ADC 66 for one cycle of the CLK signal. Calibration control circuit 75 compares the value of the element of output sequence Y of ADC 66 produced in response to VREF to its expected value to determine the error in ADC 66, and then calculates and supplies calibration data to calibration circuit 72 to update its programming so that it compensates for the error in ADC 66 output sequence Y.

During each clock cycle in which ADC 66 receives reference signal VREF, rather than input signal X, ADC output signal Y will reflect the magnitude of VREF rather than the magnitude of input signal X. Delay circuit 68 delays sequence Y for K cycles of clock signal CLK, so during the $K^{th}$ clock cycle following a cycle in which ADC 66 digitizes VREF, the value of the current element of sequence $Y_a$ will reflect the magnitude of reference signal VREF rather than input signal X. Calibration control circuit 75 therefore signals switch 70 to pass the output $Y_c$ of an interpolation filter 73, rather than $Y_a$ as input $Y_b$ to calibration circuit 72. Interpolation filter 73, suitably a finite-impulse response (FIR) filter, uses interpolation to estimate an appropriate value of the current element of $Y_c$ as a function of values of preceding and succeeding elements of the Y sequence. The K cycle delay of the delay circuit 68 matches the processing latency of the interpolation filter 73, a function of the number of succeeding elements the filter uses in the calculation. Thus for each sample of analog input signal X that is skipped during a calibration cycle, interpolation filter 73 subsequently fills in the missing data element with an estimated value $Y_c$ for that sample.

When ADC 66 samples analog signal X at a frequency more than twice that of its highest frequency component, it is possible for interpolation filter 73 to accurately estimate the value of a skipped sample of analog signal X through interpolation of magnitudes of several preceding and succeeding samples. However, the accuracy of the interpolation is an increasing function of the number of neighboring samples of signal X interpolation filter 73 uses when calculating a value for a missing sample, which is in turn an increasing function of the cost and complexity of the interpolation filter.

Figure 7:
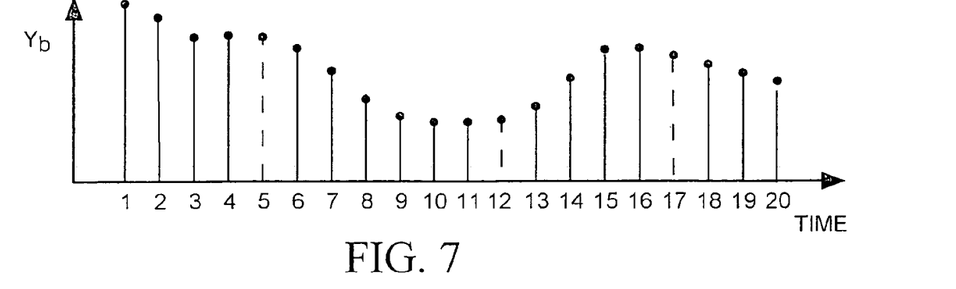
FIG. 7 is a graph plotting the value of the output data of the ADC of FIG. 6 as a function of time.

The invention relates to the manner in which calibration control circuit 75 determines when to skip a sample and carry out a calibration cycle. In particular, calibration control circuit carries out a calibration cycle only at times when the analog input signal is not varying much so that the magnitude of a skipped sample will be very similar to the magnitudes of the neighboring samples interpolation filter 73 uses when interpolating the skipped sample magnitude. For example, FIG. 7 shows a sample being skipped and interpolated at time 5 because samples at times 3 and 4 were very close together in magnitude. An FIR interpolation filter 73 having only a relatively few taps could accurately estimate the magnitude of the analog input signal sample at time 5 based on the sampled magnitude of only a few preceding and succeeding samples because the analog signal value is not changing rapidly around time 5. Similarly, samples were skipped and filled at times 12 and 17 because the analog signal X sample values were relatively stable at times 10 and 11, and at times 15 and 16. Since interpolation filter 73 need only interpolate between samples that are close together in magnitude, it can provide a very accurate estimate of the value of the skipped sample without having to implement an expensive and sophisticated interpolation scheme.

ADC 62 of FIG. 6 includes a calibration timing circuit 77 for asserting a signal CAL to tell calibration control circuit 75 when to initiate each calibration cycle. Calibration timing circuit 77 counts the number of CLK signal cycles since the last calibration cycle. When its count reaches a predetermined limit (for example 100), calibration timing circuit 77 monitors the magnitude of the analog input signal X to determine when it has been relatively stable for two CLK signal cycles in that it has changed by less than some predetermined maximum. When it detects a period of stability, calibration timing circuit 77 resets its internal CLK signal cycle count and asserts its output CAL signal to tell calibration control circuit 75 to initiate another calibration cycle. Thus, calibration timing circuit 77 initiates a calibration cycle whenever input signal X has been relatively stable, but only after a predetermined number of CLK signal cycles have occurred since the most recent calibration cycle.

The skipped samples of the analog input signal must always be separated by at least the delay of interpolation circuit 73. For example, when interpolation circuit 73 is implemented by a symmetrical 9-tap FIR filter, the latency of the interpolation will be 4 CLK signal cycles. In such case calibration cycles should be separated by at least four CLK signal cycles or interpolation filter 73 won't have enough valid data samples to perform the interpolation for the skipped samples. Calibration timing circuit 77 could provide any arbitrary lower limit on the spacing between calibration cycles, as long as the number of CLK cycles between calibration cycles exceeds the interpolation delay. For example, it might provide for a minimum 100-cycle interval between calibration cycles even though the interpolation delay is only 4 cycles. In most applications it would not be necessary to perform a calibration cycle very often to keep the ADC properly calibrated because the error associated with a typical ADC 66 normally changes only slowly over time.

Calibration timing circuit 77 could monitor the magnitude of analog input signal X in various ways to determine times when it has been relatively stable. For example it could directly monitor input signal X or, if the latency of ADC 66 is not too large, calibration timing circuit 77 could monitor the most significant bits of its output sequence Y. Or, as discussed below, when ADC 66 is a pipelined ADC, calibration timing circuit 77 could monitor the low-resolution output(s) of the ADC's first stage(s).

Figure 8:
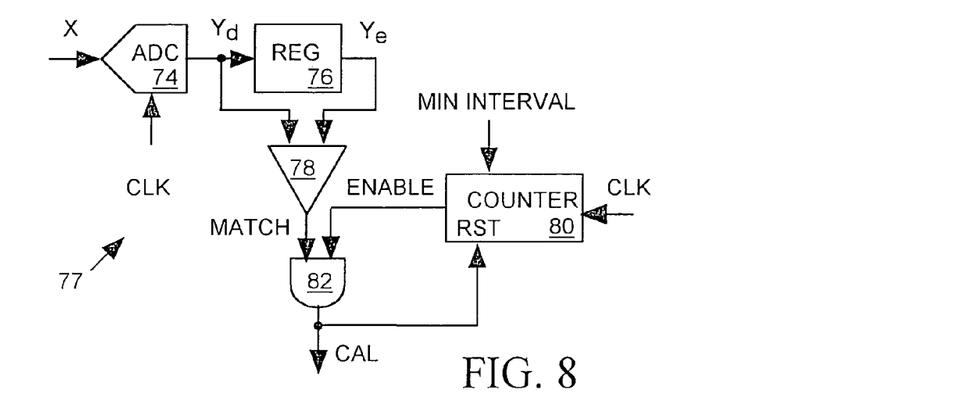
FIGS. 8 and 9 depict alternative implementations of the calibration timing circuit of FIG. 6.

FIG. 8 depicts an example implementation of calibration timing circuit 77 of FIG. 6 that directly monitors the analog input signal X. A coarse (low resolution) ADC 74 digitizes input signal X in response to the same clock signal CLK controlling the sample timing of the higher resolution ADC 66 of FIG. 6 to produce a digital data sequence $Y_d$. A register 76 delays $Y_d$ by one CLK signal cycle to produce a digital data sequence $Y_e$. A comparator 78 compares current elements of the $Y_d$ and $Y_e$ sequences and asserts its output signal MATCH when they are of the same value. Since ADC 74 has relatively coarse resolution, concurrent elements of the $Y_d$ and $Y_e$ sequences will match even though the actual magnitude of analog input signal X changes by a small amount between successive samples. Thus the MATCH signal indicates when the analog input signal has been relatively stable for one clock cycle. A counter 80 counts down from a predetermined number (MIN_INTERVAL) on each edge of the CLK signal asserts an ENABLE signal when the count reaches 0. When comparator 78 thereafter asserts the MATCH signal, an AND gate 82 asserts the CAL signal to initiate a calibration cycle. The CAL signal also resets counter 80. Thus the calibration timing circuit of FIG. 8 initiates a calibration cycle only when both of the following two conditions are true:

1. A number of CLK signal cycles since the last calibration cycle is at least as large as the number specified by MIN INTERVAL.

2. The value of Yd has remained stable, to within the resolution of ADC 74, for two CLK signal cycles.

Figure 9:
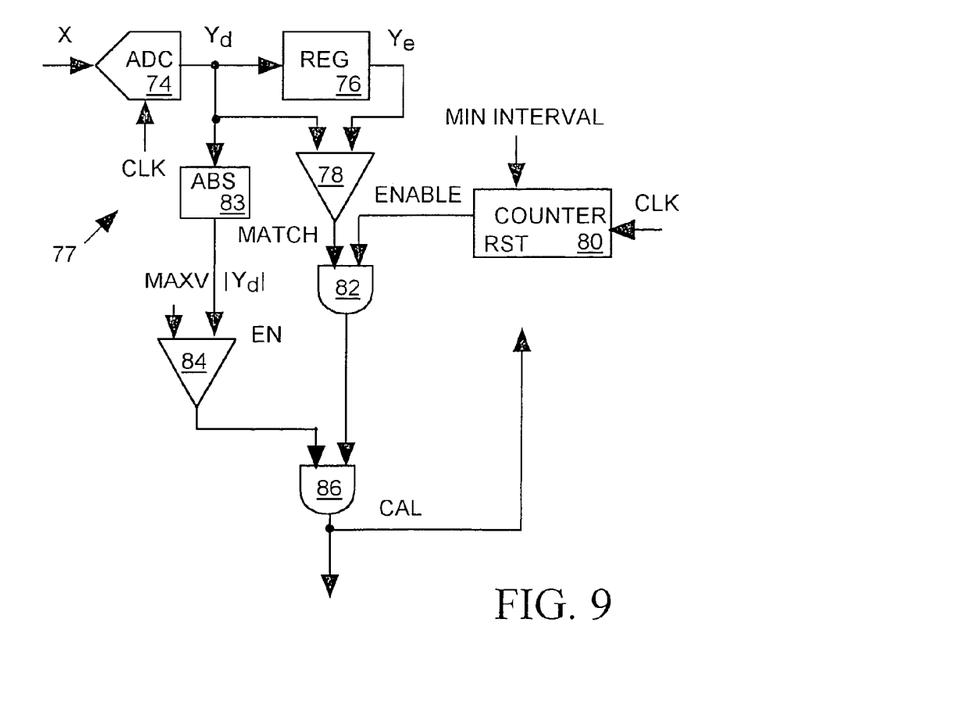

FIG. 9 illustrates a modified version of calibration timing circuit 77 of FIG. 8 wherein an absolute value circuit 83, a comparator 84 and AND gate 86 have been added. Absolute value circuit 83 finds the absolute value of $Y_d$ and comparator 84 compares $|Y_d|$ to a reference value MAXV and asserts an enable signal EN when $|Y_d|$ is less than MAXV. AND gate 86 ands the output of AND gate 82 with enable signal EN to produce the CAL signal. This embodiment of calibration timing circuit 77 helps to improve the accuracy of the interpolation by ensuring that input signal X of FIG. 6 is of low magnitude at the time a sample is skipped. When input signal X is small, the error introduced by interpolation is also small.

Thus the calibration timing circuit of FIG. 9 initiates a calibration cycle only when all of the following three conditions are true:

1. A number of CLK signal cycles since the last calibration cycle is at least as large as the number specified by MIN INTERVAL.

2. The value of Yd has remained stable, to within the resolution of ADC 74, for two CLK signal cycles.

3. The magnitude of Yd is currently less than the value of MAXV.

The calibration timing circuit 77 of FIG. 8 or 9 requires a coarse ADC 74 to directly monitor analog signal X, but if the latency of ADC 66 of FIG. 6 is not too large, it is possible to use the most significant bits of the output sequence Y of ADC 66 to provide the $Y_d$ input to register 76 since those bits of sequence Y would be equivalent to the output of coarse ADC 74. Alternatively a quantizer could quantize the output of ADC 66 to supply the $Y_d$ input to register 76. In either case ADC 74 could be eliminated.

Figure 10:
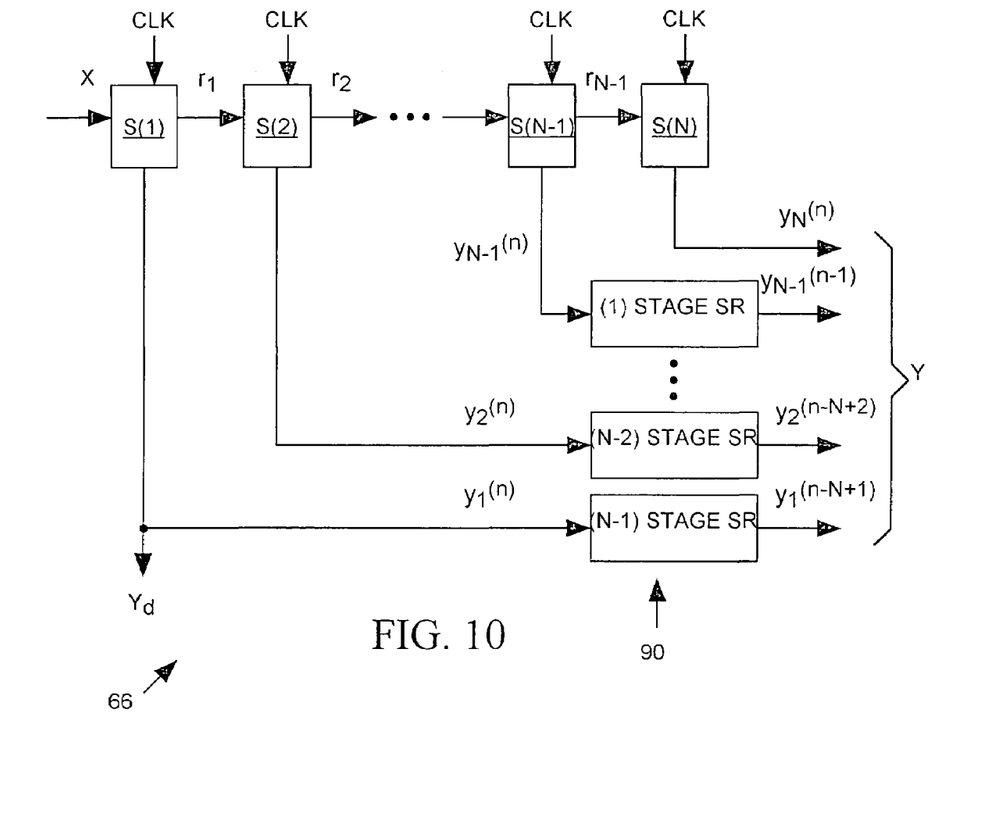
FIG. 10 depicts in block diagram form a pipelined ADC that can implement ADC 66 of FIG. 6.

It is also possible to eliminate coarse ADC 74 of FIG. 8 or 9 when ADC 66 is a pipelined ADC, because a pipelined ADC includes an internal coarse ADC that could supply $Y_d$. FIG. 10 illustrates an example pipelined ADC including a set of N stages S(1)–S(N). Each Kth stage S(K) digitizes its input signal with relatively low resolution to produce output data $y_K$ representing its input signal magnitude and also produces an analog residue signal $r_K$ supplied as the input signal to the next stage. The magnitude of the output residue signal $r_K$ of stage S(K) is proportional to the difference between the magnitude represented by $Y_K$ and the magnitude of stage input signal $r_{K-1}$, where the analog input signal X acts as input to stage S(1). A set of shift registers 90 delay each signal $y_1$ by N-K clock cycles to produce separate portions of the ADC output data sequence Y. If the pipelined ADC of FIG. 10 were to implement ADC 66 of FIG. 6, then the output $y_1$ of stage S(1) could provide the $Y_d$ input to register 76, provided stage S(1) has appropriate resolution.

As discussed above, the invention relates primarily to how calibration control circuit 75 acquires information regarding the error in the output of ADC 66 from which it determines how to adjust ADC calibration. Methods by which a calibration control circuit calibrates an ADC once the error information is known are well known in the prior art. While FIG. 6 is an example of a self-calibrating ADC 62 in accordance with the invention employing a calibration circuit 72 to adjust its output sequence, other embodiments of the invention may employ other calibration mechanisms. For example, rather than adjusting a calibration circuit 72 at the output of ADC 62, calibration control circuit 75 could directly adjust internal parameters of ADC 66. For example, calibration control circuit 75 might adjust a gain and offset of an internal input signal amplifier within ADC 66. In such case calibration circuit 72 can be omitted, with sequence $Y_b$ directly providing output sequence Y'.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A background calibrated analog/digital converter for generating an output data sequence having successive data elements representing magnitudes of successive samples of a first analog signal (X) acquired during successive cycles of a clock signal, the converter comprising:

a first circuit for producing a first sequence (Y) of data elements by digitizing the first analog signal during successive cycles of the clock signal, except during clock signal cycles in which background calibration is carried out, and by digitizing a reference signal (VREF) during cycles of the clock signal in which background calibration is carried out, and for replacing data elements of the first data sequence produced during cycles of the clock signal in which background calibration is carried out with data elements computed as functions of other data elements of the first data sequence; and a calibration timing circuit for initiating background calibration during cycles of the clock signal selected in response to a behavior of the first analog signal.

2. The background calibrated analog/digital converter in accordance with claim 1 wherein the calibration timing circuit initiates background calibration only when a variation in magnitudes of at least two most recent samples of the first analog signal has remained within a predetermined limit.

3. The background calibrated analog/digital converter in accordance with claim 2 wherein each successive element of the first sequence comprises a plurality of bits, and wherein the calibration timing circuit compares a most significant portion of the bits of successive elements of the first data sequence to determine whether the difference in magnitudes of the at least two most recent samples of the first analog signal has remained within the predetermined limit.

4. The background calibrated analog/digital converter in accordance with claim 2 wherein the first circuit comprises:

a pipelined analog/digital converter (ADC) having a plurality of stages, each periodically digitizing a stage input signal to produce a stage output data value and producing an analog stage output signal of magnitude representing a difference in magnitudes of the stage input signal and the stage output data value, the stages being connected in series such that each stage other than a first stage of the series receives as its analog stage input signal, the analog stage output signal of a preceding stage of the series, wherein the calibration timing circuit initiates background calibration only when there is no variation in at least two most recent stage output data values produced by a first stage of the pipelined ADC.

5. The background calibrated analog/digital converter in accordance with claim 2 wherein the first circuit comprises:

a pipelined analog/digital converter (ADC) having a plurality of stages, each periodically digitizing a stage input signal to produce a stage output data value and producing an analog stage output signal of magnitude representing a difference in magnitudes of the stage input signal and the stage output data value, the stages being connected in series such that each stage other than a first stage of the series receives as its analog stage input signal, the analog stage output signal of a preceding stage of the series, wherein the calibration timing circuit initiates background calibration only when the following two conditions are both true:

there is no variation of at least two most recent stage output data values produced by a first stage of the pipelined ADC, and a predetermined minimum number of clock signal cycles have occurred since the calibration timing circuit last initiated background calibration.

6. The background calibrated analog/digital converter in accordance with claim 1 wherein the calibration timing circuit initiates background calibration only when the following two conditions are both true:

a variation in magnitudes of at least two most recent samples of the first analog signal has remained within a predetermined limit, and a predetermined minimum number of clock signal cycles have occurred since the calibration timing circuit last initiated background calibration.

7. The background calibrated analog/digital converter in accordance with claim 1 wherein the calibration timing circuit initiates background calibration only when the following three conditions are all true:

a variation in magnitudes of at least two most recent samples of the first analog signal has remained within a first predetermined limit, a predetermined minimum number of clock signal cycles have occurred since the calibration timing circuit last initiated background calibration, and a magnitude of a most recent sample of the first analog signal is within a second predetermined limit.

8. The background calibrated analog/digital converter in accordance with claim 1 wherein the calibration timing circuit comprises:

a second circuit for digitizing the first analog signal to produce successive elements of a second data sequence ($Y_d$), and a third circuit for comparing successive elements of the second data sequence to determine whether they represent similar magnitudes.

9. The background calibrated analog/digital converter in accordance with claim 8 wherein the second circuit digitizes the first analog signal with lower digitizing resolution than the first.

10. The background calibrated analog/digital converter in accordance with claim 1 wherein the first circuit comprises:

a pipelined analog/digital converter (ADC) having a plurality of stages, each digitizing a stage input signal to produce stage output data value and producing an analog stage output signal of magnitude representing a difference in magnitudes of the stage input signal and the stage output data value, the stages being connected in series such that each stage other than a first stage of the series receives as its analog stage input signal, the analog stage output signal of a preceding stage of the series, wherein the calibration timing circuit initiates background calibration only when the following three conditions are true:

there is no variation in at least two most recent stage output data values produced by a first stage of the pipelined ADC, a predetermined minimum number of clock signal cycles have occurred since the calibration timing circuit last initiated background calibration, and a magnitude of a most recent sample of a most recent stage output data produced by the first stage of the pipelined ADC is within a second predetermined limit.

11. The background calibrated analog/digital converter in accordance with claim 1 further comprising:

a second circuit for calibrating the first circuit in response to a difference between magnitudes of the reference signal and magnitudes of the data elements of the first sequence produced during cycles of the clock signal in which background calibration is carried out so that the output sequence appropriately represents successive magnitudes of the first analog signal.

12. A method for calibrating an analog/digital converter generating an output data sequence having successive data elements representing magnitudes of successive samples of a first analog signal (X) acquired during successive cycles of a clock signal, the method comprising the steps of:

monitoring the first analog signal to determine when it exhibits a particular behavior, and initiating background calibration during cycles of the clock signal only after the first analog signal exhibits the particular behavior wherein background calibration is initiated only when a variation in magnitudes of at least two most recent samples of the first analog signal has remained within a predetermined limit.

13. The method in accordance with claim 12 wherein background calibration is initiated only when the following two conditions are both true:

a variation in magnitudes of at least two most recent samples of the first analog signal has remained within a predetermined limit, and a predetermined minimum number of clock signal cycles have occurred since the calibration timing circuit last initiated background calibration.

14. The method in accordance with claim 12 wherein background calibration is initiated only when the following three conditions are all true:

a variation in magnitudes of at least two most recent samples of the first analog signal has remained within a first predetermined limit, a predetermined minimum number of clock signal cycles have occurred since the calibration timing circuit last initiated background calibration, and a magnitude of a most recent sample of the first analog signal is within a second predetermined limit.

15. The method in accordance with claim 12 wherein the step of monitoring the first analog signal to determine when it exhibits a particular behavior comprises the substeps of:
digitizing the first analog signal to produce successive elements of a second data sequence ($Y_d$), and
comparing successive elements of the second data sequence to determine whether they represent similar magnitudes.

16. The method in accordance with claim 12
wherein each successive element of the first sequence comprises a plurality of bits, and
wherein the step of monitoring the first analog signal to determine when it exhibits a particular behavior comprises comparing a most significant portion of the bits of successive elements of the first data sequence to determine whether the difference in magnitudes of the at least two most recent samples of the first analog signal has remained within the predetermined limit.

17. The method in accordance with claim 12
wherein the analog/digital converter comprises a pipelined analog/digital converter (ADC) having a plurality of stages, each periodically digitizing a stage input signal to produce a stage output data value and producing an analog stage output signal of magnitude representing a difference in magnitudes of the stage input signal and the stage output data value, the stages being connected in series such that each stage other than a first stage of the series receives as its analog stage input signal, the analog stage output signal of a preceding stage of the series, and
wherein the step of initiating background calibration comprises comparing most recent stage output data values produced by a first stage of the pipelined ADC to determine whether the difference in magnitudes of the at least two most recent samples of the first analog signal has remained within the predetermined limit.

18. The method in accordance with claim 12 further comprising the step of
calibrating the analog/digital converter in response to a difference between magnitudes of the reference signal and magnitudes of the data elements of the first sequence produced during cycles of the clock signal in which background calibration is carried out so that the output sequence appropriately represents successive magnitudes of the first analog signal.

* * * * *